United States Patent
Huang et al.

(10) Patent No.: US 6,548,360 B2
(45) Date of Patent: Apr. 15, 2003

(54) ELECTROSTATIC DISCHARGE PROTECTION APPARATUS WITH SILICON CONTROL RECTIFIER AND THE METHOD OF FABRICATING THE SAME

(75) Inventors: Chiu-Tsung Huang, Hsinchu (TW); Wen-Kuan Yeh, Chupei (TW); Lu-Min Liu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/951,072

(22) Filed: Sep. 10, 2001

(65) Prior Publication Data

US 2002/0030232 A1 Mar. 14, 2002

Related U.S. Application Data

(62) Division of application No. 09/585,977, filed on Jun. 2, 2000, now Pat. No. 6,376,882.

(30) Foreign Application Priority Data

May 4, 2000 (TW) ........................................ 89108501 A

(51) Int. Cl.⁷ ..................... H01L 21/336; H01L 21/20; H01L 21/469
(52) U.S. Cl. ................. 438/300; 438/301; 438/303; 438/305; 438/479; 438/480; 438/481; 438/766; 438/607
(58) Field of Search ....................... 438/154, 300, 438/301, 303, 305, 306, 479, 480, 481, 766, 607

(56) References Cited

U.S. PATENT DOCUMENTS

| | | | | |
|---|---|---|---|---|
| 5,807,771 A | * | 9/1998 | Vu et al. ................ | 438/154 |
| 6,190,977 B1 | * | 2/2001 | Wu ....................... | 438/300 |
| 6,303,450 B1 | * | 10/2001 | Park et al. ............. | 438/300 |
| 6,342,421 B1 | * | 1/2002 | Mitani et al. .......... | 438/300 |
| 6,391,692 B1 | * | 5/2002 | Nakamura .............. | 438/151 |

* cited by examiner

*Primary Examiner*—Amir Zarabian
*Assistant Examiner*—Toniae M. Thomas
(74) *Attorney, Agent, or Firm*—J.C. Patents

(57) ABSTRACT

An electrostatic discharge protection apparatus with silicon control rectifier and the method of fabricating the apparatus. Using silicon on insulator technique, a bottom layer, a P-well, a first source/drain region, a second source/drain region and a gate are formed. A selective epitaxial growth region is selectively formed on the first source/drain region, and an $N^+$ region is formed on the bottom layer. The lower portion of the $N^+$ region is then adjacent to the P-well, and the upper portion of the $N^+$ region is adjacent to the gate. Thus, a PNPN silicon control rectifier is formed, and the silicon on insulation CMOS technique is effectively transplanted into the electrostatic discharge apparatus.

9 Claims, 1 Drawing Sheet

ELECTROSTATIC DISCHARGE PROTECTION APPARATUS WITH SILICON CONTROL RECTIFIER AND THE METHOD OF FABRICATING THE SAME

CROSS-REFERENCE TO RELATED APPLICATION

This application is a divisional application of, and claims the priority benefit of U.S. application Ser. No. 09/585,977 filed on Jun. 2, 2000 now U.S. Pat. No. 6,376,882 B2.

BACKGROUND OF THE INVENTION

1. Field of the Invention

The invention relates in general to an electrostatic discharge protection (ESD) apparatus. More particularly, this invention relates to the formation of an ESD apparatus with silicon control rectifier (SCR) using a silicon on insulator (SOI) CMOS technique and a selective epitaxial growth (SEG) technique.

2. Description of the Related Art

During the fabrication process of an integrated circuit (IC), such as a dynamic random access memory (DRAM) or a static random access memory (SRAM), or after the fabrication process of a chip is completed, electrostatic discharge is a common cause of damage to the integrated circuit. For example, when one walks on carpet in high relative humidity (HR), electrostatic voltage ranging from several hundred to several thousand volts can be carried. When the relative humidity is low, the electrostatic voltage can be more than ten thousand volts. If such electrostatic voltage is applied to he chips, several kinds of electrostatic discharge apparatus have to be employed to avoid damaging the chips. A conventional mechanism for electrostatic discharge protection is to form an on-chip electrostatic discharge circuit between each pad and the internal circuit.

FIG. 1 illustrates a conventional electrostatic discharge protection circuit with silicon control rectifier. Near the surface of an N-well 10, two P-regions 12, 14 are formed as a drain region and a source region. On the N-well 10 between the drain region 12 and the source region 14, a $P^+$ region 16 is formed as a gate. An N region 18 is formed adjacent to the P region 14. Thus constructed, a PNPN silicon control rectifier structure is formed with the sequential arrangement of P region 12, N-well 10, P region 14 and N region 18.

The above circuit is formed in a way of bulk CMOS that results in a very poor heat dissipation effect. When a large current flows through, the device is easily blown. With the development of sub-micron fabrication techniques, the SOI COMS technique is now commonly used to enhance the operation speed and to obtain lower power consumption and a lower leakage current. The adapted theory is to add an insulation layer under and near the substrate surface, so as to isolate the substrate surface of the CMOS from the silicon bulk. Thus, the latch up between the source region and the substrate and between the well and substrate can be prevented. However, the above electrostatic discharge protection structure cannot employ the SOI CMOS technique.

SUMMARY OF THE INVENTION

The invention provides an electrostatic discharge protection circuit with a silicon control rectifier. Using selective epitaxial growth, the resistance of the source/drain region can be reduced, and the SOI CMOS technique can be employed.

The electrostatic discharge protection apparatus comprises a bottom layer, a P-well, a first source/drain region, a second source/drain region, a gate, a selective epixatial growth region and an $N^+$ region. The P-well is located on the bottom layer, while the first and the second source/drain regions are formed within the P-well. The gate is formed on a part of the first source/drain region, a part of the P-well and a part of the second source/drain region. The selective epitaxial growth region is formed on the first source/drain region and next to the gate. The $N^+$ region is formed on the bottom layer with its bottom portion adjacent to the P-well, and its top portion adjacent to the gate. Due to the formations of the selective epitaxial growth region and the $N^+$ region, the junction depth is deepened to effectively reduce the resistance and improve the heat dissipation.

The bottom layer is formed using SOI technique to include a substrate layer as a lower portion and an insulation layer on the substrate layer. The substrate layer can be a P-type substrate material, and the insulation layer can be made of silicon dioxide. In addition, the gate further comprises a pair of spacers on the sidewalls thereon. The spacers are respectively adjacent to the selective epitaxial growth region and the $N^+$ region. A P region is typically selected for the selective epitaxial growth region. N regions with a lower dopant concentration than the $N^+$ region are typically selected for the first and the second source/drain regions.

The invention further provides a method for fabricating an electrostatic discharge protection apparatus with a silicon control recrifier. A substrate layer is provided. An insulation layer is provided on the substrate layer. A P-well is formed on the insulation layer. A gate, a first source/drain region and a second source/drain region are formed on the P-well. The first and the second source/drain regions are formed in the P-well at two sides of the gate. A selective epitaxial growth region is further formed on the first source/drain region. An $N^+$ region is formed on the insulation layer. The $N^+$ region is downwardly connected to the P-well, the second source/drain region and the gate.

Similarly, the above substrate layer can be formed of a P-type substrate, and the insulation layer may comprise silicon dioxide to construct the SOI CMOS. In addition, the gate further comprises a pair of spacers on a pair of sidewalls to connect with the selective epitaxial growth region and the $N^+$ region. A P-type region is typically used as the selective epitaxial growth region. An N-type region with a dopant concentration lower than that of the $N^+$ region is used for forming the first and the second source/drain regions.

Both the foregoing general description and the following detailed description are exemplary and explanatory only and are not restrictive of the invention as claimed.

DESCRIPTION OF THE PREFERRED EMBODIMENTS

Figure 1:
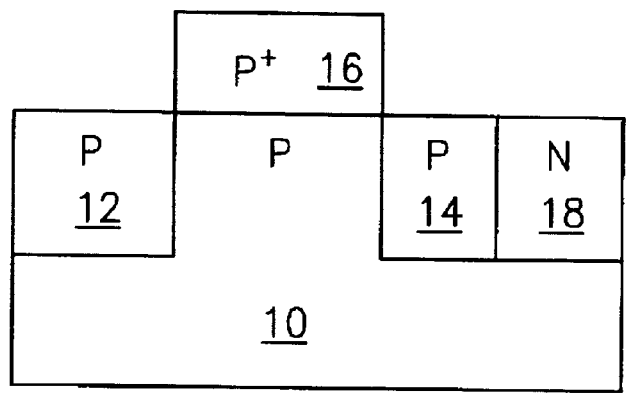
FIG. 1 shows a conventional electrostatic discharge protection apparatus.
Figure 2:
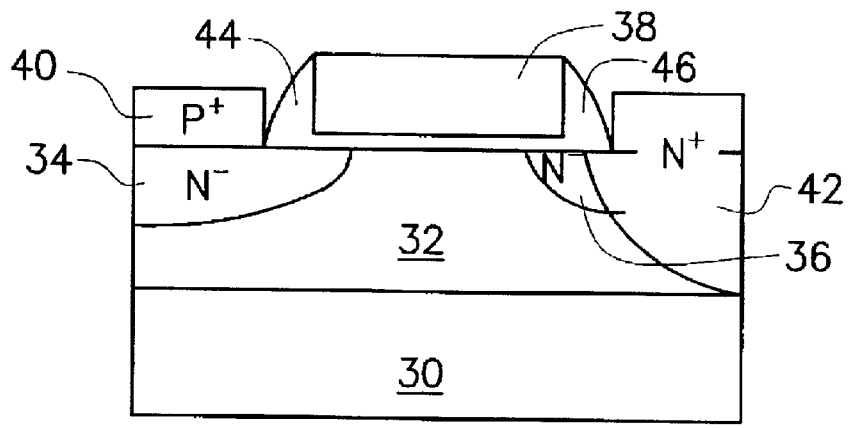
FIG. 2 shows an electrostatic discharge protection apparatus according to one embodiment of the invention.

In FIG. 2, an electrostatic discharge protection apparatus is illustrated. The electrostatic discharge protection apparatus comprises a bottom layer 30, a P-well 32, a first source/drain region 34, a second source/drain region 36, a gate 38, a selective epitaxial growth region 40 and an N+ region 42. As shown in FIG. 2, the bottom layer 30 is in the bottom most position of the electrostatic discharge protection apparatus. The bottom layer further comprises a substrate and an insulation layer on the substrate. Preferably, the bottom layer 30 is formed using the SOI CMOS technique to have an insulation layer made of a silicon dioxide layer covering a P-type substrate.

The P-well 32 is formed on the bottom layer 30. Within the P-well 32, the first source/drain region 34 and the second source/drain region 36 are formed. The gate 38 with a pair of spacers 44 and 46 are formed on the P-well 32 between the first and the second source/drain regions 34 and 36. On the first source/drain region 34, the selective epitaxial growth region 40 is formed adjacent to the spacer 44 of the gate 38. For example, the selective epitaxial growth region 40 is formed of a P-type doped region. The N+ region 42 is formed on the bottom layer 30. The N+ region 42 comprises a bottom portion adjacent to the bottom layer, a middle portion adjacent to the second source/drain region 36, and a top portion protruding from the P-well 32 and adjacent to the spacer 46 of the gate 38. Preferably, the N+ region 42 is also a selective epitaxial growth region formed by the SOI technique. Both the first and the second source/drain regions 34 and 36 are doped with N-type ions with a concentration lower than that of the N+ region 42. In this manner, the junction depth is deepened to effectively reduce the resistance.

Figure 3:
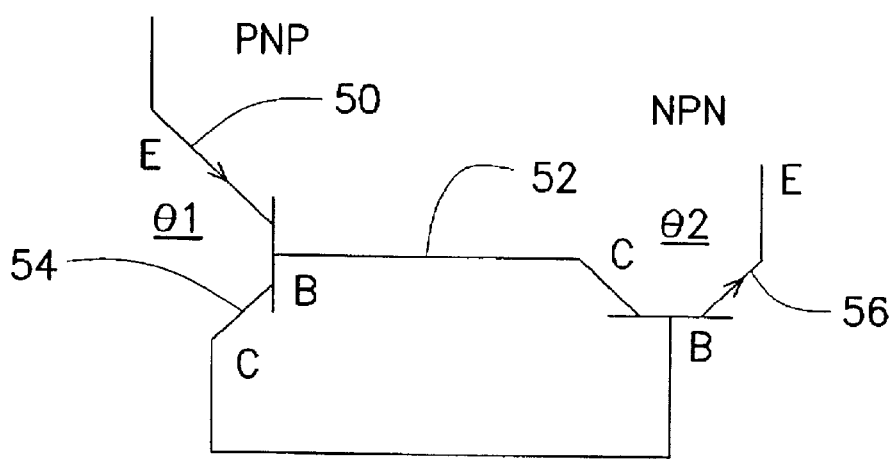
FIG. 3 shows an equivalent circuit diagram of an electrostatic discharge protection apparatus as illustrated in FIG. 2.

FIG. 3 illustrates a circuit diagram equivalent to the electrostatic discharge protection apparatus as shown in FIG. 2. In FIG. 3, two bipolar junction transistors (BJT) Q1 and Q2 are included. The bipolar junction transistor Q1 has a base connected to a collector of the bipolar junction transistor Q2. The collector of the transistor Q1 is connected to a base of the transistor Q2. In FIG. 2, the sequential arrangement of the selective epitaxial growth region 40, the first source/drain region 34, the P-well 32 and the N+ region 42 demonstrates a PNPN structure of silicon control rectifier constructed as an electrostatic discharge protection apparatus.

Thus, the emitter 50, the base 52 and the collector 54 of the PNP transistor Q1 corresponds to the selective epitaxial growth region 40 (P+ region), the first source/drain regin 34 (N− region) and the P-well 32.

Similarly, the collector 52, the base 54 and the emitter 56 of the NPN transistor Q2 corresponds to the first source/drain region 34 (N region), the P-well 32 and the N+ region 42.

In addition, the invention provides a method for fabricating the electrostatic discharge protection apparatus as shown in FIG. 2. A P-type substrate is provided. An insulation layer such as a silicon dioxide layer is formed on the P-type substrate. The P-type substrate covered by the insulation layer thus form a bottom layer 30. A P-well 32 is formed on the bottom layer 30. Using deposition and ion implantation, a gate 38 is formed on the P-well 32, and a first source/drain region 34 and a second source/drain region 36 are formed in the P-well 32 with the gate 38 as a mask. The first and the second source/drain regions 34 and 36 can be formed using the lightly doped drain region (NLDD) technique. A pair of spacers 44 and 46 are further formed on two sidewalls of the gate 38.

On the first source/drain region 34, using P-type ions, a selective epitaxial growth region 40 is formed adjacent to the gate 38 (the spacer 44). The selective epitaxial growth region 40, the first source/drain region 34 and the P-well 32 thus constructs the PNP bipolar junction transistor Q1. An N+ ion implantation is further performed on the P-well 32 to form the N+ region 42. The N+ region 42 has a bottom portion adjacent to the bottom layer 30, a middle portion adjacent to the second source/drain region 36 and a top portion adjacent to the gate 38 (the spacer 46). The N+ region 42 has an ion concentration higher than that of the first and the second source/drain regions 34 and 36. Thus, the N+ region, the P-well 32 and the second source/drain region 36 form the NPN bipolar junction transistor Q2.

Preferably, in this particular embodiment, the first and the second source/drain regions are formed asymmetrical in size. It is appreciated that people skilled in the art may alter the sizes and ther parameters such as the dopant concentration according to specific requirements of the devices to obtain the best quality.

The above structure of the electrostatic discharge protection apparatus and the method of fabricating the apparatus employs the SOI CMOS technique to reduce the resistance of the source/drain region by forming a selective epitaxial growth region. In addition, the above silicon control rectifier of the SOI electrostatic discharge protection apparatus is formed without using an additional photomask, that is, without increasing the fabrication cost and time.

Other embodiments of the invention will appear to those skilled in the art from consideration of the specification and practice of the invention disclosed herein. It is intended that the specification and examples to be considered as exemplary only, with the true scope and spirit of the invention being indicated by the following claims.

What is claimed is:

1. A method of fabricating an electrostatic discharge protection providing a substrate layer;

forming an insulation layer on the substrate layer;

forming a P-well on the insulation layer;

forming a gate, a first and a second source/drain region, wherein the gate is formed on the P-well, while the first and the second source/drain regions are formed in the P-well with the gate forming a selective epitaxial growth region protruding from the first source/drain region next to the gate; and forming an N-type region adjacent to the second source/drain region, the N-type region located in and protruding from the P-well with a bottom portion adjacent to the insulation layer and a top portion adjacent to the gate.

2. The method according to claim 1, wherein the step of providing the substrate layer comprises a step of providing a P-type substrate.

3. The method according to claim 1, wherein the step of forming the insulation layer comprises a step of forming a silicon dioxide layer on the substrate layer.

4. The method according to claim 1, wherein the step of forming the gate comprises a step of forming a pair of spacers on both sidewalls of the gate, so that both the selective epitaxial growth region and the N+ region are adjacent to one of the spacers.

5. The method according to claim 1, wherein the step of forming the selective epitaxial growth region comprises a step of forming a P-type region.

6. The method according to claim 1, wherein the step of forming the N+ region comprises a step of forming an N-type region with a doping concentration higher than that of the first and the second source/drain regions.

7. A method of fabricating an electrostatic discharge protection apparatus with a silicon control rectifier, the method comprising:

providing a substrate layer having an insulation layer;

forming a P-well in the substrate over the insulation layer;

forming a gate, a first and a second N-type source/drain region, wherein the gate is formed on the P-well, while the first and the second N-type source/drain regions are formed in the P-well with the gate as a mask;

forming a P-type selective epitaxial growth region protruding from the first N-type source/drain region next to the gate; and forming an N-type region adjacent to the second N-type source/drain region, the N-type located region in and protruding from the P-well with a bottom portion adjacent to the insulation layer and a top portion adjacent to the gate.

8. The method of claim 7, wherein the N-type region is a N-type selective epitaxial growth region.

9. The method of claim 1, wherein the N-type region is a N-type selective epitaxial growth region.

* * * * *